(12) United States Patent
Maffeis

(10) Patent No.: US 10,395,754 B2
(45) Date of Patent: Aug. 27, 2019

(54) METHOD FOR DECODING BITS IN A SOLID STATE DRIVE, AND RELATED SOLID STATE DRIVE

(71) Applicant: NandEXT S.r.l., Località Dogana (SM)

(72) Inventor: Margherita Maffeis, Dalmine (IT)

(73) Assignee: NandEXT Srl (SM)

( * ) Notice: Subject to any disclaimer, the term of this patent is extended or adjusted under 35 U.S.C. 154(b) by 49 days.

(21) Appl. No.: 15/076,409

(22) Filed: Mar. 21, 2016

(65) Prior Publication Data

US 2017/0269994 A1 Sep. 21, 2017

(51) Int. Cl.
  *H03M 13/45* (2006.01)
  *G11C 29/52* (2006.01)
  *G11C 11/56* (2006.01)
  *G06F 11/10* (2006.01)
  *H03M 13/11* (2006.01)
  *H03M 13/37* (2006.01)
  *H03M 13/00* (2006.01)
  *G11C 29/04* (2006.01)

(52) U.S. Cl.
  CPC .......... *G11C 29/52* (2013.01); *G06F 11/1012* (2013.01); *G11C 11/5628* (2013.01); *G11C 11/5642* (2013.01); *H03M 13/1105* (2013.01); *H03M 13/3707* (2013.01); *H03M 13/3723* (2013.01); *H03M 13/458* (2013.01); *H03M 13/6325* (2013.01); *G11C 2029/0409* (2013.01); *G11C 2029/0411* (2013.01); *H03M 13/1108* (2013.01); *H03M 13/1111* (2013.01)

(58) Field of Classification Search
  CPC ............ G11C 2029/0411; G11C 29/52; G11C 11/5628; G11C 11/5642; G11C 2029/0409; G06F 11/1076; G06F 11/1008; G06F 11/106; G06F 11/1012; H05K 999/99; H03M 13/6325; H03M 13/3723; H03M 13/3707; H03M 13/1105; H03M 13/458; H03M 13/1111; H03M 13/1108
  USPC ........................................................ 714/764
  See application file for complete search history.

(56) References Cited

U.S. PATENT DOCUMENTS

| 7,966,550 B2 * | 6/2011 | Mokhlesi | G06F 11/1068 714/773 |
| 8,482,978 B1 * | 7/2013 | Perlmutter | G11C 11/5642 365/185.03 |
| 2003/0061560 A1 * | 3/2003 | Furukawa | G06F 11/1072 714/764 |

(Continued)

*Primary Examiner* — Samir W Rizk
*Assistant Examiner* — Enam Ahmed
(74) *Attorney, Agent, or Firm* — John M. Janeway; Janeway Patent Law PLLC

(57) ABSTRACT

A method is proposed for decoding read bits including information bits from memory cells of a solid state drive. The method comprises determining a reliability indication indicative of a reliability of the read bits, and iterating the following sequence of steps:
  soft decoding the read bits based on said reliability indication in order to obtain said information bits,
  determining at least one among a time indication indicative of a time elapsed since a last writing of the memory cells and a temperature indication indicative of a temperature of the memory cells, and
  applying at least one among said time indication and said temperature indication to said reliability indication.
A corresponding solid state drive is also proposed.

32 Claims, 8 Drawing Sheets

(56) References Cited

U.S. PATENT DOCUMENTS

Figure 1A:
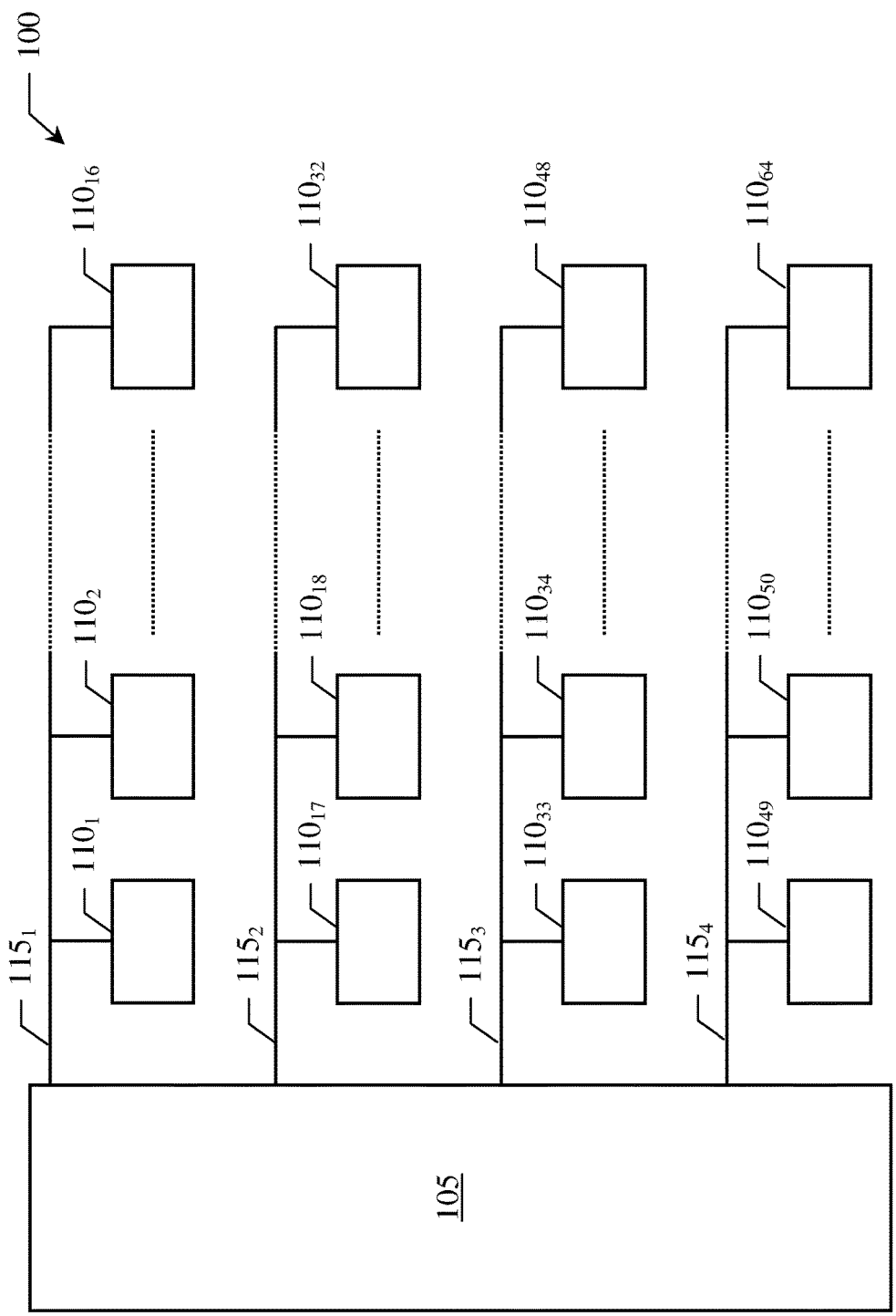

| | | | | |
|---|---|---|---|---|
| 2004/0128549 | A1* | 7/2004 | Poisner | G06F 1/14 |
| | | | | 726/22 |
| 2004/0264561 | A1* | 12/2004 | Alexander | H04L 25/0204 |
| | | | | 375/232 |
| 2009/0210772 | A1* | 8/2009 | Noguchi | G06F 11/1068 |
| | | | | 714/764 |
| 2013/0139035 | A1* | 5/2013 | Zhong | G11C 11/5642 |
| | | | | 714/773 |
| 2014/0136760 | A1* | 5/2014 | Sprouse | G06F 12/0246 |
| | | | | 711/103 |
| 2014/0136764 | A1* | 5/2014 | Li | G11C 16/08 |
| | | | | 711/103 |
| 2014/0281808 | A1* | 9/2014 | Lam | G06F 11/1048 |
| | | | | 714/764 |
| 2015/0149873 | A1* | 5/2015 | Cai | H03M 13/458 |
| | | | | 714/773 |
| 2015/0270007 | A1* | 9/2015 | Sommer | G11C 16/3404 |
| | | | | 365/185.09 |
| 2015/0303948 | A1* | 10/2015 | Yoon | G11C 29/52 |
| | | | | 714/764 |
| 2016/0093372 | A1* | 3/2016 | Fainzilber | G11C 11/5642 |
| | | | | 714/764 |
| 2016/0124808 | A1* | 5/2016 | Zhang | G06F 11/1068 |
| | | | | 714/764 |
| 2016/0179615 | A1* | 6/2016 | Lee | G11C 29/52 |
| | | | | 714/764 |

* cited by examiner

METHOD FOR DECODING BITS IN A SOLID STATE DRIVE, AND RELATED SOLID STATE DRIVE

BACKGROUND OF THE INVENTION

Field of the Invention

The present invention generally relates to "Solid State Drives" (hereinafter, SSD devices), such as SSD devices provided with non-volatile memory chips (e.g., NAND flash memory chips) for storing data. More particularly, the present invention relates to SSD devices provided with error correction capabilities. Even more particularly, the present invention relates to a method for decoding bits in such SSD devices, and to SSD devices (or controllers thereof) implementing the method.

Overview of the Related Art

SSD devices are nowadays widely used, for example as storage units of computers in replacement of HDD ("Hard Disk Drives").

A common SSD device comprises non-volatile memory chips (for example, NAND flash memory chips) each one including non-volatile memory cells for storing data (bits) even in the absence of external power supply, and a SSD device controller (hereinafter, SSD controller) for managing SSD device operations, such as write (program/erase) and read operations.

Each memory cell comprises a floating gate transistor. Each bit or group of bits (identifying a respective logical state of the memory cell) is physically stored in each memory cell in the form of electric charge in the floating gate, which defines a corresponding threshold voltage of the transistor. The number of bits each memory cell is capable of storing depends on memory cell technology. For example, in "Single-Level Cell" (SLC) technology each memory cell (or SLC memory cell) is capable of storing one symbol (or bit pattern) comprising one bit (i.e. two logical states, 0 or 1, defining two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining eight threshold voltages).

While, ideally, all memory cells in a memory chip should feature same (nominal) threshold voltages for same logical states (or, equivalently, for same symbols), practically each threshold voltage associated with a corresponding logical state (or, equivalently, with a corresponding symbol) differs across the memory cells and defines a respective threshold voltage distribution (typically, a Gaussian-type probability distribution), thus resulting in a number of threshold voltage distributions equal to the possible logical states each memory cell can take.

Ideally, the threshold voltage distributions are spaced apart from one another, and a corresponding reference voltage is set between each pair of adjacent threshold voltage distributions for sensing/reading the logical state of the memory cells. This is schematically shown in the top drawing of FIG. 2B for a 2-bit MLC memory cell (hereinafter referred to as MLC memory cell for the sake of conciseness) and in the top drawing of FIG. 2C for a TCL memory cell. In such figures the threshold voltage distributions are denoted by $D_j$ (j ranging from 1 to 4 for the MLC memory cell and from 1 to 8 for the TLC memory cell).

Figure 2A:
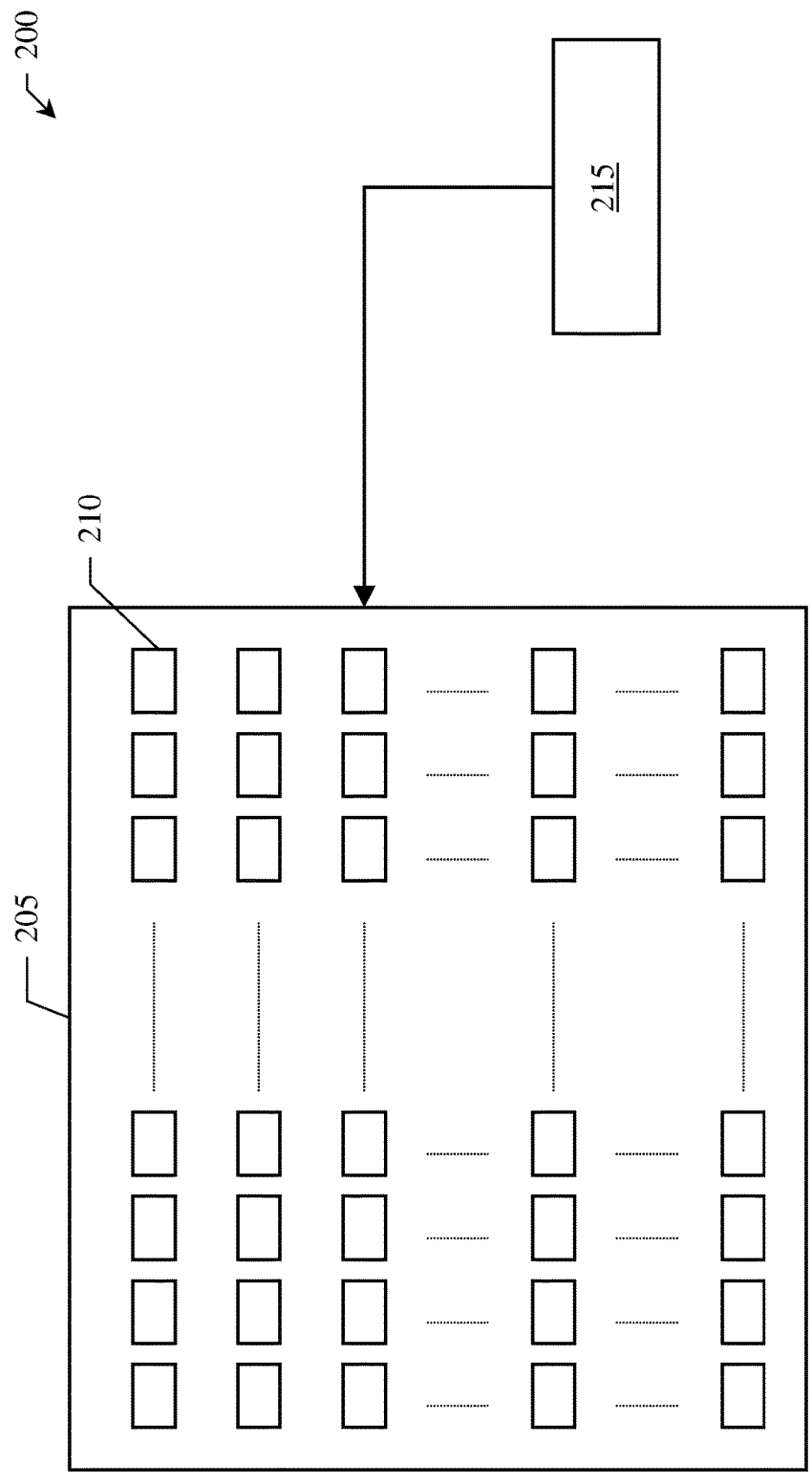
Figure 2B:
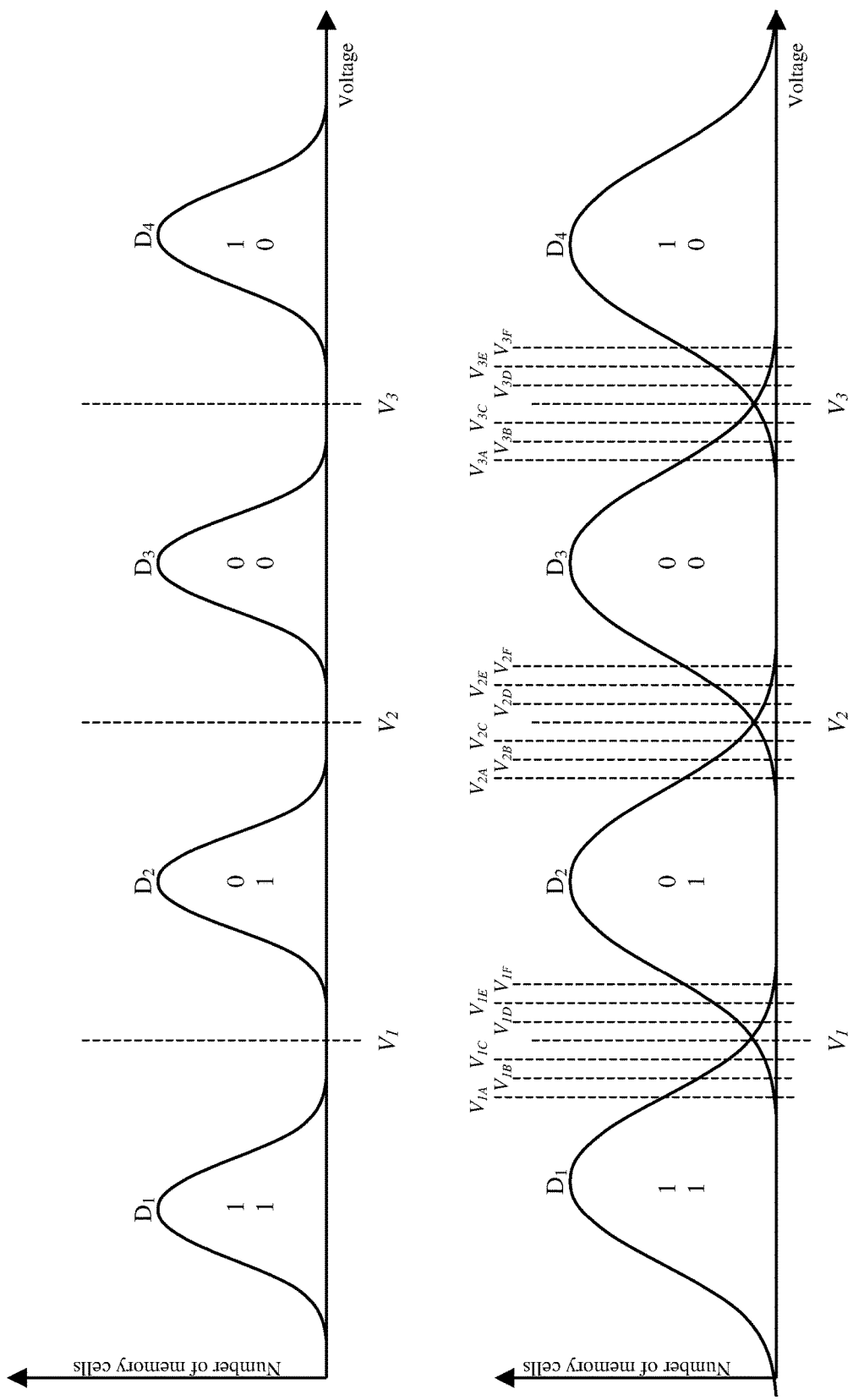
Figure 2C:
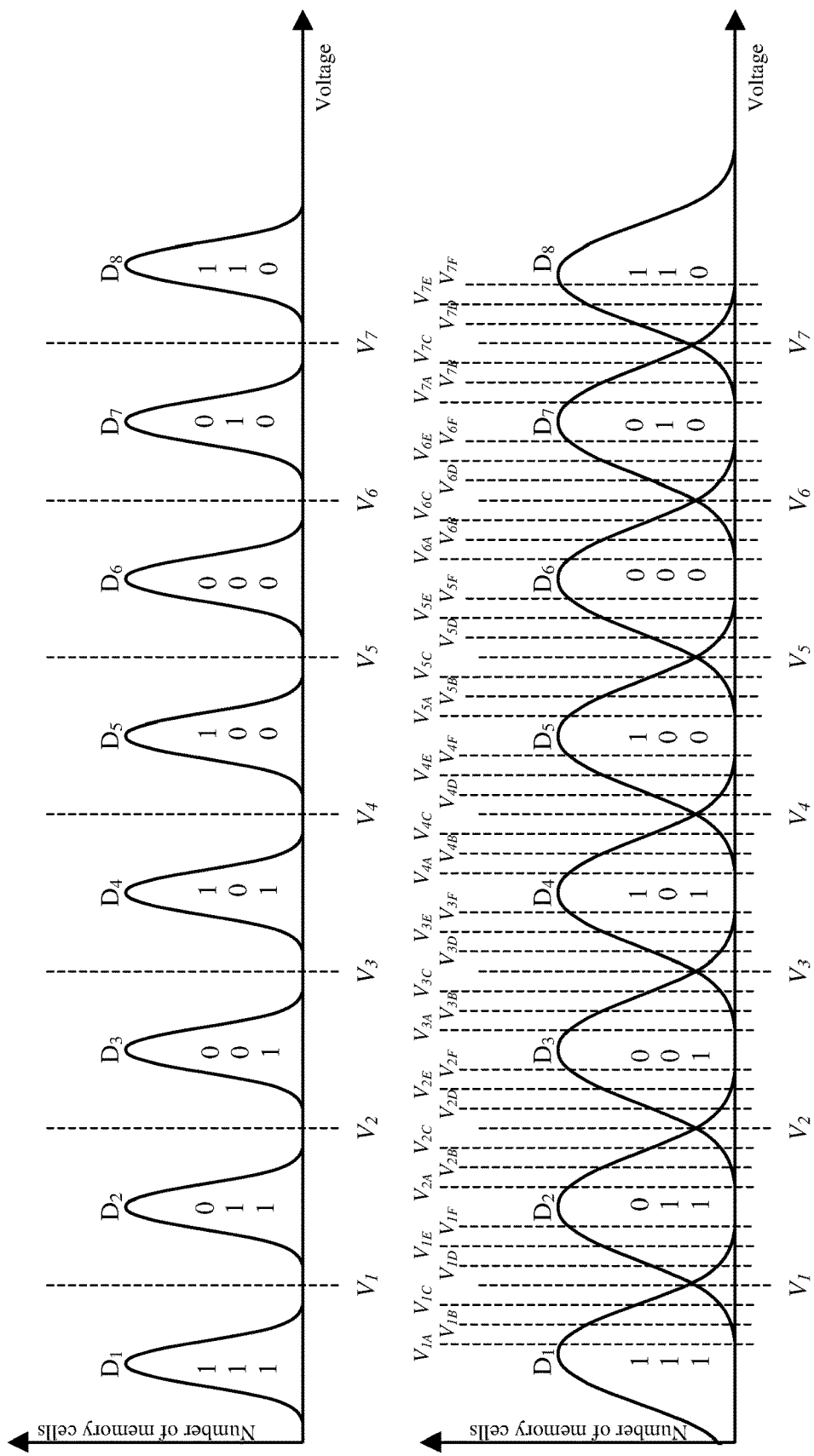

As visible in these drawings, the threshold voltage distributions $D_j$ are (ideally) spaced apart from one another, and a corresponding reference voltage $V_k$ (usually referred to as hard reference voltage) is set between each pair of adjacent threshold voltage distributions $D_j$ for sensing/reading the logical state of the memory cells (k=1, 2, 3 in the example of FIG. 2B and k=1, 2, 3, 4, 5, 6, 7 in the example of FIG. 2C).

In case of the MLC memory cell, during a read operation a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10".

In case of the TLC memory cell, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages $V_3$ and $V_4$ represents the symbol "101", a threshold voltage between the hard reference voltages $V_4$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110".

To read a memory cell, the threshold voltage of the memory cell is compared to the hard reference voltages $V_k$. Typically, reading a memory cell that stores a symbol of m bits requires, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$. However, the increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference and retention errors, which translates into partially overlapping areas of adjacent threshold voltage distributions $D_j$ (shown in the bottom drawings of FIGS. 2B and 2C) and, hence, into the increasing of the number of bit errors.

In order to compensate for larger bit errors, and to increase SSD device reliability, "Forward Error Correction" has been proposed (and typically implemented in the SSD controller) for locating and correcting bit errors. According to "Forward Error Correction" principles, the bits to be stored are encoded in a redundant way (e.g., by adding parity bits) by means of an "Error Correction Code" (ECC code), so that redundancy allows detecting a limited number of bit errors that may occur anywhere in the read bits, and to correct these errors without rereading. Generally, the number of detectable and correctable bit errors increases as the number of parity bits in the ECC code increases.

The probability of corrupted read bits, which therefore contains incorrect bits, before correction is referred to as "Raw Bit Error Rate" (RBER). The RBER is typically estimated (e.g., by the SSD controller) according to a shape of the threshold voltage distributions $D_j$, and particularly according to the overlapping areas of the adjacent threshold voltage distributions $D_j$.

As a result of the advances in memory cell technology, the RBER for selected memory cells is increasingly nearing the Shannon limit of the communication channel. The RBER observed after application of the ECC code is referred to as "Frame Bit Error Rate" (FER), whereas the FER divided by the number of read bits is referred to as "Uncorrectable Bit Error Rate" (UBER).

The acceptable UBER is often dependent upon the application in which the SSD device is intended to be employed. In the case of price sensitive, consumer applications, which experience a relatively low number of accesses (e.g., program/erase cycles), the SSD device may tolerate a higher UBER as compared to a high-end application experiencing a relatively high number of accesses, such as an enterprise application.

To achieve an acceptable UBER, especially for enterprise applications, ECC codes such as "Low-Density Parity-Check" (LDPC) codes have been widely used (both alone and in combination with other ECC codes), which allow determining each bit value by means of hard bits (i.e., the read bits resulting from comparisons to the hard reference voltages $V_k$) and of additional information including soft bits and an indication of the reliability of each read (hard and soft) bit typically evaluated according to RBER—the decoding based on the hard and soft bits being referred to as hard and soft decoding, respectively.

In the known solutions, the soft bits mainly arise from multiple read operations. Indeed, according to a common approach, when a read operation takes place on the selected memory cells, and the number of bit errors is found to be higher than correction capabilities of the "Forward Error Correction", the flash memory device (e.g., the SSD controller thereof) is typically configured to reread the selected memory cells at different values of the reference voltages to attempt to establish the bits in those areas of the threshold voltage distributions $D_j$ wherein bit error is most likely. Such multiple readings are typically carried out by moving the hard reference voltages $V_k$ in a neighborhood thereof, thus obtaining a number of additional reference voltages (or soft reference voltages) $V_{kA}$-$V_{kF}$ associated with each hard reference voltage $V_k$ (in the following the overall reference voltages including both the hard reference voltages $V_k$ and the associated soft reference voltages $V_{kA}$-$V_{kF}$ will be also denoted, as a whole, by reference voltages $V_{kA},V_{kA}$-$V_{kF}$ for the sake of conciseness).

SUMMARY OF THE INVENTION

The Applicant has recognized that nowadays SSD devices, especially those currently most widespread (such as the SSD devices based on MLC and TLC technologies, hereinafter referred to as MLC and TLC SSD devices) are not satisfactory.

According to the Applicant, this is substantially due to the fact that the RBER is affected by retention errors, which cause a relatively frequent occurrence of soft decoding failures (i.e. failures to decode the read bits with an acceptable UBER). Retention errors, caused by charge leakage over time after a memory cell is programmed, are the dominant source of SSD device errors. Indeed, as SSD device process technology scales to smaller feature sizes, the capacitance of each memory cell, and the number of electrons stored on it, decreases—for example, the known MLC memory cells can only store about 100 electrons. Gaining or losing several electrons on a memory cell can significantly change its threshold voltage and eventually alter its original logical state. This issues are exacerbated when increasing the number of bits each memory cell is capable of storing.

The known solutions are based on the common approach of reducing retention errors by periodically reading, correcting, and reprogramming the memory cells before the number of errors accumulated over time exceed the error correction capability of the ECC code. However, this approach burdens the computational effort of the SSD device, and particularly of its SSD controller.

In addition, in most of known solutions, in response to a failure of the soft decoding—e.g., because of retention errors—the number of soft reference voltages $V_{kA}$-$V_{kF}$ (and hence of read operations of the selected memory cells) is increased.

However, the Applicant has understood that increasing the number of soft reference voltages $V_{kA}$-$V_{kF}$ could result in very expensive read access times (and, hence, in latency overhead), and that the corresponding increased number of soft bits could result in excessive area overhead. These issues are exacerbated in nowadays SSD devices, which are smaller and smaller and whose bits per memory cell are increasingly growing, as the narrow distance between the threshold voltage distributions $D_j$ requires more and more soft bits to allow correct soft decoding. For example, a typical (2-bit) MLC SSD device may need 21 references voltages $V_{kA},V_{kA}$-$V_{kF}$ (as illustrated in the bottom drawing of FIG. 2B) or more thereof (depending on the desired resolution) for both hard and soft decoding (as compared to 3 hard reference voltages $V_k$ needed for only hard decoding), whereas a typical TLC SSD device may need 49 references voltages $V_{kA},V_{kA}$-$V_{kF}$ (as illustrated in the bottom drawing of FIG. 2C) or more thereof (depending on the desired resolution) for both hard and soft decoding (as compared to the 7 hard reference voltages $V_k$ needed for only hard decoding).

The Applicant has tackled the above-discussed issues, and has devised a method for improving decoding of read bits with no area nor latency overheads.

In particular, the Applicant has understood that retention errors, and hence the soft decoding failures caused by them, may be influenced by a number of parameters of the SSD device (including, for example, temperature, time from a last programming of the memory cells, and number of program/erase cycles already performed on the memory cells), hereinafter SSD device parameters, and that these parameters affect the threshold voltage distributions $D_j$ (and hence the RBER). Starting from this understanding, the method devised by the Applicant is generally based on adjusting the (estimate of the) RBER based on one or more among the above SSD device parameters, thus substantially avoiding, or at least minimizing, the read operations on the memory cells.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a method for decoding read bits including information bits from memory cells of a solid state drive. The method comprises determining a reliability indication indicative of a reliability of the read bits, and iterating the following sequence of steps:

soft decoding the read bits based on said reliability indication in order to obtain said information bits, determining at least one among a time indication indicative of a time elapsed since a last writing of the memory cells and a temperature indication indicative of a temperature of the memory cells, and applying at least one among said time indication and said temperature indication to said reliability indication.

According to an embodiment of the present invention, said determining at least one among a time indication and a temperature indication, and said applying at least one among said time indication and said temperature indication to said reliability indication are carried out if said soft decoding has failed.

According to an embodiment of the present invention, said determining at least one among a time indication and a temperature indication, and said applying at least one among said time indication and said temperature indication to said reliability indication are carried out if said soft decoding has failed and if a number of iterations is lower than a predetermined number of iterations.

According to an embodiment of the present invention, the method further comprises hard decoding the read bits, said iterating being preferably carried out if said hard decoding the read bits has failed.

According to an embodiment of the present invention, the method further comprises determining an operative lifetime of the solid state drive, and if the operative lifetime of the solid state drive is lower than a predetermined operative lifetime, performing hard decoding the read bits, or if the operative lifetime of the solid state drive is higher than the predetermined operative lifetime, performing said iterating.

According to an embodiment of the present invention, said determining an operative lifetime of the solid state drive is based on a number of program/erase cycles performed on the solid state drive.

According to an embodiment of the present invention, said determining an operative lifetime of the solid state drive is based on a time of use of the solid state drive.

According to an embodiment of the present invention, the method further comprises, after said hard decoding the read bits:

if said hard decoding is successful, determining a number of errors of the decoded read bits, and if the number of errors of the decoded read bits is higher than a predetermined number of errors indicative that the hard decoding of the same read bits is expected to fail at a following hard decoding thereof, identifying the read bits as critical read bits.

Preferably, said hard decoding the read bits comprises hard decoding only the read bits that are not critical read bits.

According to an embodiment of the present invention, each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution. Preferably, said reliability indication depends on a "Raw Bit Error Rate" estimate indicative of overlapping areas between adjacent threshold voltage distributions.

According to an embodiment of the present invention, said temperature indication comprises a temperature difference between a temperature of the memory cells determined during reading of the memory cells and a temperature of the memory cells determined during the last writing of the memory cells. Preferably, said "Raw Bit Error Rate" estimate changes with temperature according to a predetermined temperature dependence and, even more preferably, said applying said temperature indication to said reliability indication comprises correcting the "Raw Bit Error Rate" estimate according to said temperature difference and to said predetermined temperature dependence.

According to an embodiment of the present invention, said time indication comprises a time difference between a current time where reading of the memory cells takes place and a time since the last writing of the memory cells. Preferably, said "Raw Bit Error Rate" estimate changes with time according to a predetermined time dependency and, even more preferably, said applying said time indication to said reliability indication comprises correcting the "Raw Bit Error Rate" estimate according to said time difference and to said predetermined time dependence.

According to an embodiment of the present invention, said soft decoding is based on a "Low Density Parity Check" (LDPC) code.

Another aspect of the present invention proposes a controller for a solid state drive. The controller comprises a control unit for determining a reliability indication indicative of a reliability of read bits being read from memory cells of the solid state drive. The control unit is arranged for iteratively:

causing a soft decoding unit to soft decode the read bits based on said reliability indication in order to obtain information bits, causing a time unit to determine a time indication indicative of a time elapsed since a last writing of the memory cells and/or a temperature unit to determine a temperature indication indicative of a temperature of the memory cells, and applying at least one among said time indication and said temperature indication to said reliability indication.

According to an embodiment of the present invention, the control unit is arranged for causing the time unit to determine the time indication and/or the temperature unit to determine the temperature indication, and for applying at least one among said time indication and said temperature indication to said reliability indication if the soft decoding unit has failed to soft decode the read bits.

According to an embodiment of the present invention, the control unit is arranged for causing the time unit to determine the time indication and/or the temperature unit to determine the temperature indication, and for applying at least one among said time indication and said temperature indication to said reliability indication if the soft decoding unit has failed to soft decode the read bits and if a number of iterations is lower than a predetermined number of iterations.

According to an embodiment of the present invention, the method further comprises a hard decoding unit for hard decoding the read bits. Preferably, the control unit is arranged for performing said iterations if said hard decoding the read bits has failed.

According to an embodiment of the present invention, the control unit is further arranged for determining an operative lifetime of the solid state drive, and if the operative lifetime of the solid state drive is lower than a predetermined operative lifetime, causing the hard decoding unit to perform said hard decoding of the read bits, or if the operative lifetime of the solid state drive is higher than the predetermined operative lifetime, performing said iterations.

According to an embodiment of the present invention, the operative lifetime of the solid state drive is based on a number of program/erase cycles performed on the solid state drive.

According to an embodiment of the present invention, said operative lifetime of the solid state drive is based on a time of use of the solid state drive.

According to an embodiment of the present invention, if said hard decoding is successful, the hard decoding unit is arranged for providing a number of errors of the decoded read bits. Preferably, the control unit is arranged for identifying the read bits as critical read bits if the number of errors of the decoded read bits is higher than a predetermined number of errors indicative that the hard decoding of the same read bits is expected to fail at a following hard decoding thereof. Even more preferably, the control unit is arranged to cause the hard decoding unit to perform said hard decoding only on the read bits that are not critical read bits.

According to an embodiment of the present invention, each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution. Preferably, said reliability indication depends on a "Raw Bit Error Rate" estimate indicative of overlapping areas between adjacent threshold voltage distributions.

According to an embodiment of the present invention, said temperature indication comprises a temperature difference between a temperature of the memory cells determined during reading of the memory cells and a temperature of the memory cells determined during the last writing of the memory cells. Preferably, said "Raw Bit Error Rate" estimate changes with temperature according to a predetermined temperature dependence and, even more preferably, the control unit is arranged for applying said temperature indication to said reliability indication by correcting the "Raw Bit Error Rate" estimate according to said temperature difference and to said predetermined temperature dependence.

According to an embodiment of the present invention, said time indication comprises a time difference between a current time where reading of the memory cells takes place and a time since the last writing of the memory cells. Preferably, said "Raw Bit Error Rate" estimate changes with time according to a predetermined time dependency. More preferably, the control unit is arranged for applying said time indication to said reliability indication by correcting the "Raw Bit Error Rate" estimate according to said time difference and to said predetermined time dependence.

According to an embodiment of the present invention, said soft decoding unit is based on a "Low Density Parity Check" (LDPC) code.

A further aspect of the present invention proposes a solid state drive. The solid state drive comprises a control unit for determining a reliability indication indicative of a reliability of read bits being read from memory cells of the solid state drive. The control unit is arranged for iteratively:

causing a soft decoding unit to soft decode the read bits based on said reliability indication in order to obtain information bits, causing a time unit to determine a time indication indicative of a time elapsed since a last writing of the memory cells and/or a temperature unit to determine a temperature indication indicative of a temperature of the memory cells, and applying at least one among said time indication and said temperature indication to said reliability indication.

According to an embodiment of the present invention, the control unit is arranged for causing the time unit to determine the time indication and/or the temperature unit to determine the temperature indication, and for applying at least one among said time indication and said temperature indication to said reliability indication if the soft decoding unit has failed to soft decode the read bits.

According to an embodiment of the present invention, the control unit is arranged for causing the time unit to determine the time indication and/or the temperature unit to determine the temperature indication, and for applying at least one among said time indication and said temperature indication to said reliability indication if the soft decoding unit has failed to soft decode the read bits and if a number of iterations is lower than a predetermined number of iterations.

According to an embodiment of the present invention, the method further comprises a hard decoding unit for hard decoding the read bits, the control unit being preferably arranged for performing said iterations if said hard decoding the read bits has failed.

According to an embodiment of the present invention, the control unit is further arranged for determining an operative lifetime of the solid state drive, and if the operative lifetime of the solid state drive is lower than a predetermined operative lifetime, causing the hard decoding unit to perform said hard decoding of the read bits, or if the operative lifetime of the solid state drive is higher than the predetermined operative lifetime, performing said iterations.

According to an embodiment of the present invention, the operative lifetime of the solid state drive is based on a number of program/erase cycles performed on the solid state drive.

According to an embodiment of the present invention, said operative lifetime of the solid state drive is based on a time of use of the solid state drive.

According to an embodiment of the present invention, if said hard decoding is successful, the hard decoding unit is arranged for providing a number of errors of the decoded read bits. Preferably, the control unit is arranged for identifying the read bits as critical read bits if the number of errors of the decoded read bits is higher than a predetermined number of errors indicative that the hard decoding of the same read bits is expected to fail at a following hard decoding thereof. More preferably, the control unit is arranged for causing the hard decoding unit to perform said hard decoding only on the read bits that are not critical read bits.

According to an embodiment of the present invention, each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution. Preferably, said reliability indication depends on a "Raw Bit Error Rate"

estimate indicative of overlapping areas between adjacent threshold voltage distributions.

According to an embodiment of the present invention, said temperature indication comprises a temperature difference between a temperature of the memory cells determined during reading of the memory cells and a temperature of the memory cells determined during the last writing of the memory cells. Preferably, said "Raw Bit Error Rate" estimate changes with temperature according to a predetermined temperature dependence and, more preferably, the control unit is arranged for applying said temperature indication to said reliability indication by correcting the "Raw Bit Error Rate" estimate according to said temperature difference and to said predetermined temperature dependence.

According to an embodiment of the present invention, said time indication comprises a time difference between a current time where reading of the memory cells takes place and a time since the last writing of the memory cells. Preferably, said "Raw Bit Error Rate" estimate changes with time according to a predetermined time dependency. More preferably, the control unit is arranged for applying said time indication to said reliability indication by correcting the "Raw Bit Error Rate" estimate according to said time difference and to said predetermined time dependence.

According to an embodiment of the present invention, said soft decoding unit is based on a "Low Density Parity Check" (LDPC) code.

According to an embodiment of the present invention, the memory cells are flash memory cells.

According to an embodiment of the present invention, said memory cells are NAND flash memory cells.

BRIEF DESCRIPTION OF THE ANNEXED DRAWINGS

Figure 1B:
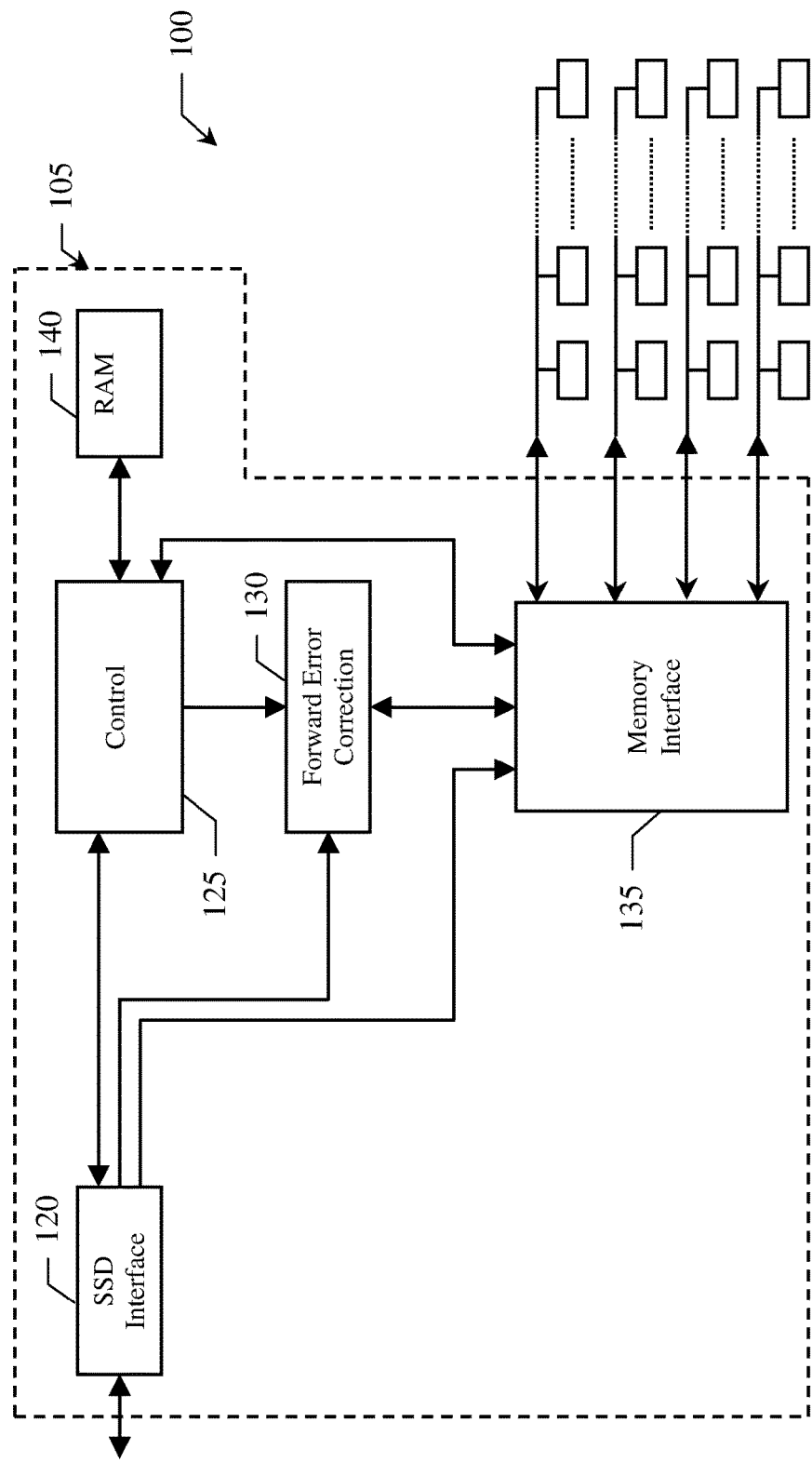
Figure 3A:
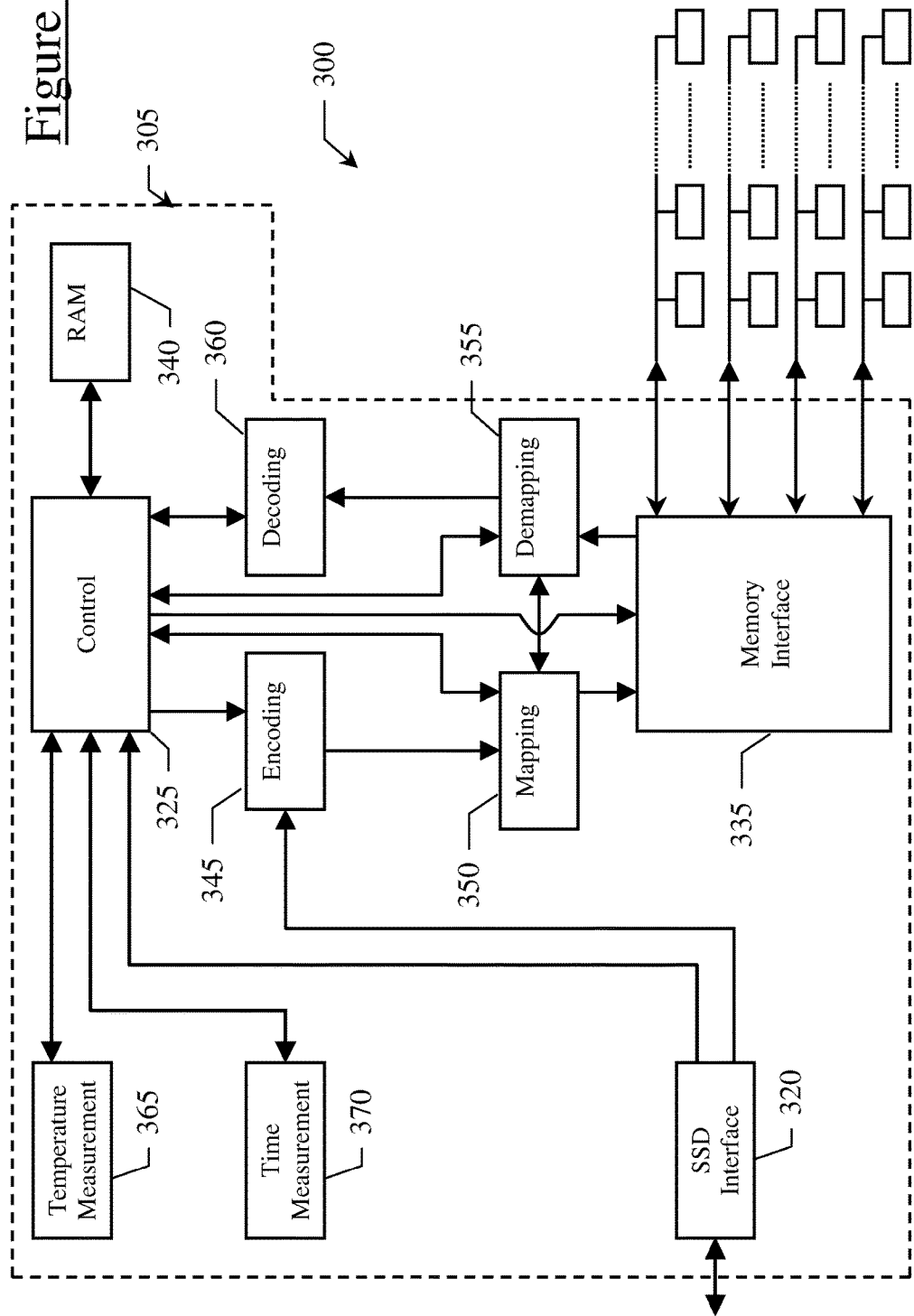
Figure 3B:
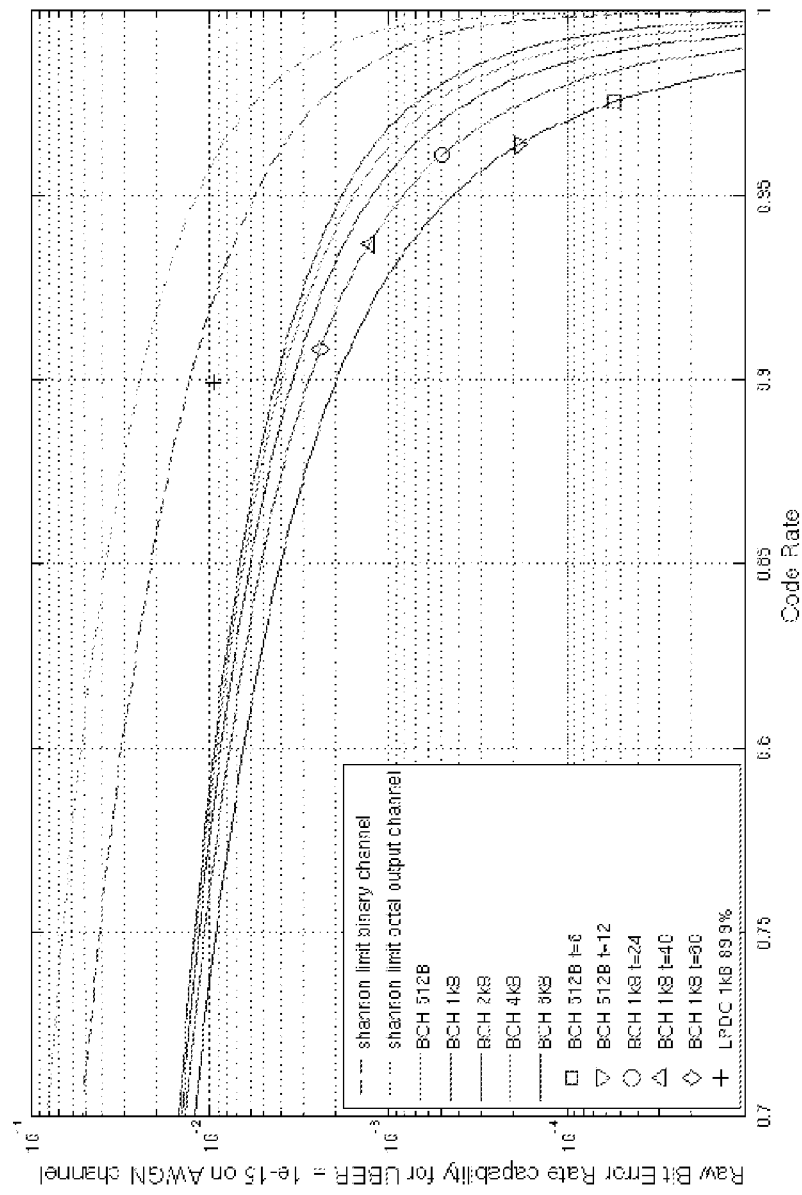
Figure 4:
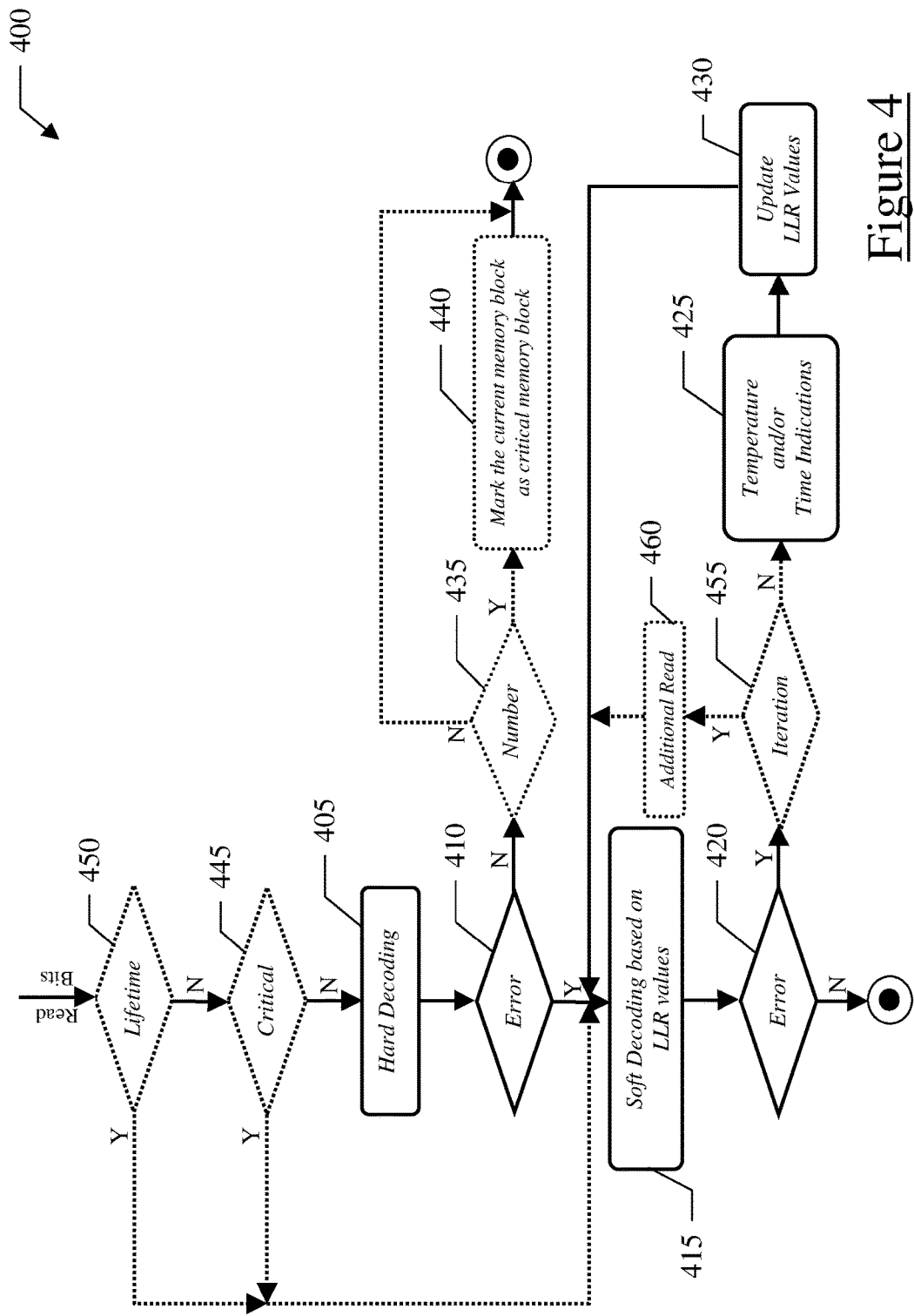

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIGS. 2B and 2C schematically show exemplary ideal and real threshold voltage distributions of MLC memory cells and of TLC memory cells, respectively, of said flash memory die;

FIG. 3A schematically shows a simplified architecture of a SSD controller according to the present invention;

FIG. 3B shows a diagram of "Raw Bit Error Rate" capability, with respect to code rate, of some exemplary ECC codes, including a "Low Density Parity Check" code that can be used in the "Forward Error Correction" unit of the SSD controller of FIG. 3A, and FIG. 4 schematically shows an activity diagram of a decoding procedure carried out by the SSD controller of FIG. 3A according to an embodiment of the present invention.

DETAILED DESCRIPTION OF PREFERRED EMBODIMENTS OF THE INVENTION

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) 110$i$ for storing bits even in the absence of external power supply (i=1, 2, 3, ..., I, with I=64 in the example at issue), and a plurality of (e.g., synchronous and/or asynchronous) channels 115$_j$ (j=1, 2, 3, ..., J, with J=4 in the example at issue) communicably coupling the SSD controller 105 and the memory chips 110$i$ to each other—in the exemplary illustration, each channel 115$_j$ communicably couples the SSD controller 105 to a set of 16 memory chips 110$_i$ (e.g., with the channels 115$1$, 115$_2$, 115$_3$ and 115$_4$ that communicably couple the SSD controller 105 to the memory chips 110$_1$-110$_{16}$, 110$_{17}$-110$_{32}$, 110$_{33}$-110$_{48}$ and 110$_{49}$-110$_{64}$, respectively).

With reference also to FIG. 1B, it schematically shows, in terms of operating units, a simplified architecture of a typical SSD controller 105—the term "unit" being herein intended to emphasize functional (rather than implementation) aspects thereof (each unit including, for example, hardware or circuitry with processing and/or storing capabilities). For the sake of completeness, such a figure also shows, with a smaller size, the memory chips 110$i$ and the channels 115$_j$ (the memory chips and the channels being unnumbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but are not limited to, information bits to be stored (i.e., the information bits to be written in the memory chips 110$_i$), read information bits (i.e., the information bits stored in, and read from, the memory chips 110$_i$), user commands indicative of the operations to be performed by the SSD controller 105 on the memory chips 110$_i$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to the memory chips 110$i$ along the channels 115 and bit transport to and from the SSD interface unit 120, and coordinating enabling and/or disabling of the memory chips 110$i$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110i$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bit transport between the SSD controller 105 and the memory chips $110_i$ along the respective channels $115_j$, the SSD controller 105 comprises one (as herein exemplary illustrated) or more memory interface units 135—alternatively, a memory interface unit 135 for each channel $115_j$ can be provided, or a memory interface unit 135 for each memory chip $110_i$, or for each group of memory chips $110_i$ can be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_i$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (e.g., in a bi-directional manner) to the control unit 125 for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, as detailed below), and, when required, for feeding the control unit 125 with the stored information.

A typical flash memory chip $110_i$ may comprise one or more flash memory dice.

A typical flash memory die, illustrated in FIG. 2A and denoted by the number reference 200, comprises one (as depicted) or more memory arrays 205 of memory cells (e.g., NAND flash memory cells) 210 arranged in rows and columns. Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

Each memory cell 210 comprises a floating gate transistor (not illustrated). Each bit or group of bits (or symbol, or bit pattern) identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one symbol comprising one bit (i.e. two logical states, 0 or 1, defining, i.e. being associated with, two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining, i.e. being associated with, eight threshold voltages). In the following, explicit reference will be made to SSD devices having MLC or TLC memory cells (referred to as MLC and TLC SSD devices, respectively), which the present invention is mainly (but not exclusively) intended to.

While, ideally, all memory cells 210 in the flash memory die 200 should feature same (nominal) threshold voltages for same logical states (or, equivalently, for same symbols), practically each threshold voltage associated with a corresponding logical state (or, equivalently, associated with a corresponding symbol) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take. This is schematically shown in the top drawing of FIG. 2B for a MLC memory cell and in the top drawing of FIG. 2C for a TCL memory cell.

As discussed in the introductory part of this description, the threshold voltage distributions $D_j$ are (ideally) spaced apart from one another, and a corresponding hard reference voltage $V_k$ is set between each pair of adjacent threshold voltage distributions $D_j$ for sensing/reading the logical state of the memory cells 210 (k=1, 2, 3 in the example of FIG. 2B and k=1, 2, 3, 4, 5, 6, 7 in the example of FIG. 2C).

In the case of MLC memory cell, during a read operation, a threshold voltage below the hard reference voltage $V_1$ represents the bit pattern "11", a threshold voltage between the hard reference voltages $V_1$ and $V_2$ represents the bit pattern "01", a threshold voltage between the hard reference voltages $V_2$ and $V_3$ represents the bit pattern "00", and a threshold voltage above the hard reference voltage $V_3$ represents the bit pattern "10". In the case of TLC memory cell, during a read operation, a threshold voltage below the hard reference voltage $V_1$ represents the bit pattern "111", a threshold voltage between the hard reference voltages $V_1$ and $V_2$ represents the bit pattern "011", a threshold voltage between the hard reference voltages $V_2$ and $V_3$ represents the bit pattern "001", a threshold voltage between the hard reference voltages $V_3$ and $V_4$ represents the bit pattern "101", a threshold voltage between the hard reference voltages $V_4$ and $V_5$ represents the bit pattern "100", a threshold voltage between the hard reference voltages $V_5$ and $V_6$ represents the bit pattern "000", a threshold voltage between the hard reference voltages $V_6$ and $V_7$ represents the bit pattern "010", and a threshold voltage above the hard reference voltage $V_7$ represents the bit pattern "110".

To read a memory cell 210, the threshold voltage of the memory cell 210 is compared to the hard reference voltages $V_k$. According to an embodiment, reading a memory cell 210 that stores a symbol of m bits requires, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

The two bits stored in a MLC memory cell are usually referred to as "Least Significant Bit" (LSB bit) and "Most Significant Bit" (MSB bit)—with reference to the conceptual representation of vertically arranged symbol associated with the respective threshold voltage distribution $D_j$, the LSB and MSB bits are assumed to be the bottom and top bits, respectively—whereas the three bits stored in a TLC memory cell are usually referred to as "Least Significant Bit" (LSB bit), "Center Significant Bit" (CSB bit) and "Most Significant Bit" (MSB bit)—with reference to the conceptual representation of vertically arranged symbol associated with the respective threshold voltage distribution $D_j$, the LSB, CSB and MSB bits are assumed to be the bottom, central and top bits, respectively. The terms LSB, CSB and MSB are used only as a reference to specific bits within the memory cell, and do not imply that certain bits are more important than others (in this respect, any other suitable terminology can also be used).

According to a typical implementation, different bits in a given group of memory cells 210 correspond to different memory pages.

For example, a group of eight-logical states (TLC) memory cells 210 can be used for storing three memory pages, a first page in the LSB bits of the memory cells of the group (thus referred to as LSB page), a second page in the CSB bits of the memory cells of the group (thus referred to as CSB page), and a third page in the MSB bits of the memory cells of the group (thus referred to as MSB page). Similarly, a group of four-logical states (MLC) memory cells can be used for storing LSB and MSB pages.

Back to FIG. 2A, the memory die 200 preferably comprises peripheral circuits (such as decoders, multiplexers, drivers, buffers, sense amplifiers), which, being not relevant for the present description, are represented in the figure by means of a single functional block (denoted by the number reference 215). Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer retention errors, i.e. a loss of the capability of the memory cells to retain the stored bits over time caused by progressive damage of the oxide layer (due to the high electrical fields applied at each program/erase operation) that determines an undesired flow of electrons away/in the floating gate.

Retention errors translate into partially overlapping areas of adjacent threshold voltage distributions $D_j$ (shown in the bottom drawings of FIGS. 2B and 2C) and, hence, into increasing of the probability of the number of bit errors per unit time (i.e., the RBER).

With reference now to FIG. 3A, it schematically shows, in terms of operating units, a simplified architecture of a SSD controller 305 according an embodiment the present invention. For the sake of completeness, such a figure also shows, in a smaller size, the memory chips 110i and the channels 115j (equivalent to those illustrated in the previous figures), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units may also intended to represent corresponding method steps.

As visible in the figure, the SSD controller 305 comprises, similarly to the SSD controller 105, a SSD interface 320, a control unit 325, a memory interface unit 335, and a memory unit 340, which will not be discussed again for the sake of conciseness.

The SSD controller 305 also comprises an encoding unit 345 for encoding the bits to be stored in the memory array 205 (i.e., the information bits) by means of an ECC code. According to an embodiment of the present invention, the encoding unit 345, and the respective decoding unit (discussed in the following), are implemented in the FEC unit 130.

Preferably, the ECC code is an ECC code allowing soft decoding—or, otherwise stated, an ECC code that allows determining each bit value by means hard bits (i.e., the read bits resulting from comparisons to the hard reference voltages $V_k$) and of additional information including soft bits and an indication of the reliability of each read (hard and soft) bit typically evaluated or estimated according to RBER—the decoding based on the hard and soft bits being referred to as hard and soft decoding, respectively. More preferably, the ECC code is a "Low-Density Parity-Check" (LDPC) code—hence, the encoding unit 345 will be referred to as LDPC encoding unit 345 and the corresponding encoded bits will be referred to as LDPC encoded bits. LDPC code is a linear ECC code (constructed by using a sparse bipartite graph) that allows transmitting data over a noisy channel. LDPC code is a capacity-approaching code, which means that practical constructions exist that allow the noise threshold to be set very close to the theoretical maximum (the Shannon limit given by the Shannon theorem) for a symmetric memory-less channel.

The Shannon theorem specifies the maximum rate at which data can be transmitted over a channel of a specified bandwidth in the presence of noise. More specifically, according to the Shannon theorem, a bound on the maximum amount of error-free data that can be transmitted with a specified bandwidth in the presence of the noise interference is set, assuming that the signal power is bounded, and that the Gaussian noise process is characterized by a known power or power spectral density. The noise threshold defines an upper bound for the channel noise, up to which the probability of data errors can be made as small as desired.

Thanks to soft decoding allowed by LDPC code, for a given code rate (the ratio between the information bits to the (LDPC, in the case at issue) encoding unit and the total number of bits created by the encoding unit (the total number of bits created by the encoding unit including the parity bits), LDPC code approaches the Shannon limit more than ECC codes typically used in prior art solutions (such as Bose-Chaudhuri-Hocquenghem (BCH) codescodes), which translates into area saving while maximizing the probability of accurately recovering the bits after a read operation.

This is illustrated in FIG. 3B, which shows a diagram of "Raw Bit Error Rate", with respect to code rate, of LDPC code and of different BCH codes. In the figure it is also plotted the Shannon limit.

As visible in the figure, given a code rate of 0.9, LDPC code approaches the Shannon limit more than BCH code, whereas the same RBER can be achieved by means of the BCH code only with a code rate of 0.75 (which implies a 25% area overhead).

According to an embodiment, LDPC is a variable rate LDPC code, so that it may change the code rate depending on the RBER. Advantageously, the variable rate LDPC code is a "Quasi-Cyclic Low Density Parity Check" (QC LDPC) code. Broadly speaking, a QC LDPC code has a parity check matrix that is composed of circulant matrices of the same size. Each circulant matrix is a square matrix wherein each row is one degree of right-cyclic shift of the row above it (so that the first row is also the right-cyclic shift of the last row), and wherein each column is one degree of downward-cyclic shift of the column on the left (so that the first column is also the downward-cyclic shift of the rightmost column).

Thus, by enabling different rows/columns of the circulant matrices, the number of parity bits within the circulant matrices may be kept the same while changing the number of information bits within the circulant matrices, thus implying code rate changing. Alternatively, by splitting the rows and introducing a number of all zero circulant matrices, the number of parity bits within the circulant matrices may be changed, so that the parity check matrix becomes more sparse (and the number of parity bits and information bits, and hence the code rate, is changed).

Back to FIG. 3A, the SSD controller 305 also comprises a mapping unit 350 for "mapping" the LPDC encoded bits into mapped LDPC encoded bits (the mapped LDPC encoded bits representing the symbols to be written/stored), thereafter the symbols can be stored in the memory chips $110_i$ (e.g., similarly to the above, by means of the memory interface unit 335 that transmits the symbols to the memory chips $110_i$, and thanks to control unit 325 action that controls addressing of the memory chips $110_i$ to be written/programmed). Preferably, as also conceptually illustrated by arrow connections between the SSD control unit 325, the encoding unit 345, the mapping unit 350, and the memory interface unit 335, the mapping unit 350 (and, hence, the mapping operation performed by it) can be selectively enabled by the control unit 325, and hence the LDPC encoded bits may be fed directly to the memory interface unit 335 when the mapping unit 350 is disabled. According to an embodiment of the present invention, selective enabling of the mapping unit 350 takes place after a predetermined number of detected failures (e.g., bit errors). Additionally or alternatively, selective enabling of the mapping unit 350 can take place after a predetermined working period of the SSD device 300 from its first use (e.g., after the program/erase cycles stored in the memory unit 340 reaches a predetermined number), e.g. in order to compensate for decreasing performance affecting the SSD device 300 with its use.

The SSD controller 305 further comprises demapping 355 and LDPC decoding 360 units for carrying out demapping and decoding operations to the read symbols in order to extract the information bits therefrom (the demapping and LDPC decoding operations being substantially reverse operations with respect to the encoding and mapping operations carried out at LDPC encoding 345 and mapping 350 units, respectively).

The mapping 350 and demapping 355 units are not limiting for the present invention. By way of example only, the mapping 350 and demapping 355 units may be implemented as disclosed in the U.S. patent application Ser. No. 14/789,513, and/or in the in the U.S. patent application Ser. No. 14/789,513, and/or in the U.S. patent application Ser. No. 14/789,513, and/or in the U.S. patent application Ser. No. 14/789,522, whose disclosures are herein incorporated by reference.

The LDPC decoding unit 360 is preferably configured to perform both hard and soft decoding of the read bits, more preferably the LDPC decoding unit 360 is configured to output, together with the hard or soft decoded bits, an outcome of the hard or soft decoding (e.g., an indication of a decoding success or failure), even more preferably the LDPC decoding unit 360 is configured to output an indication of a number of errors of a successful decoding. As mentioned above, by hard decoding it is meant the decoding based on the hard bits, i.e. the read bits resulting from comparisons to the hard reference voltages $V_k$, whereas by soft decoding it is meant the decoding based on the soft bits, i.e. the read bits resulting from comparisons to the soft reference voltages $V_{kA}$-$V_{kF}$, and on an indication of the reliability of the read soft bits.

Preferably, the indication of the reliability of each read (hard and soft) bit is in the form of a "Log Likelihood Ratio" value (LLR, hereinafter, LLR value) associated with that bit (i.e., a weight indicative of the probability that the read bit is correct). By way of example only, in order to meet one or more parity checks of the ECC code, an LLR value higher than 0 may indicate a bit that is more likely a 0 than a 1, while an LLR value lower than 0 may indicate a bit that is more likely a 1 than a 0. Further, a greater magnitude of the LLR value may indicate a higher probability or reliability. Thus, a bit with an LLR value equal to 63 is more likely to be a 0 than a bit with an LLR value equal to 5, and a bit with an LLR value equal to −63 is more likely to be a 1 than a bit with an LLR value equal to −5. An LLR value equal to 0 may instead indicate that the bit is equally likely to be a 0 or a 1. By way of example only, for a given RBER, the LLR values for a set of four read bits may be [50, 5, −5, −50].

The LLR values depend on RBER, whose estimate in turns depends on the shape, and particularly on the overlap areas, of the threshold voltage distributions $D_j$—each SSD device manufacturer making use of preferred estimates of the RBER, depending on specific design choices. Thus, each RBER (estimate) is associated with respective LLR values. According to an embodiment of the present invention, these LLR values are arranged in a table (hereinafter, LLR table), not shown, preferably stored in the control unit 325 of the SSD controller 305 (or in the memory unit 340) and accessed by the LDPC decoding unit 360 when required.

The soft bits mainly arise from multiple read operations. Indeed, when a read operation takes place on the selected memory cells, and the number of bit errors is found to be higher than correction capabilities of the "Forward Error Correction", the SSD controller 305 is configured to reread the selected memory cells at different values of the reference voltages to attempt to establish the bits in those areas of the threshold voltage distributions $D_j$ wherein bit error is most likely. As visible in the bottom drawings of FIGS. 2B and 2C, such multiple readings are carried out by moving the hard reference voltages $V_k$ in a neighborhood thereof, thus obtaining a number of additional reference voltages (or soft reference voltages) $V_{kA}$-$V_{kF}$ associated with each hard reference voltage $V_k$—the read operations at the soft reference voltages $V_{kA}$-$V_{kF}$ provide the soft bits, and are typically denoted as soft read operations (as opposed to the read operations at the hard reference voltages $V_k$ providing the hard bits, which are typically denoted by hard read operations). In other words, soft bits (and the associated LLR values) provide additional information that can be used by the LDPC decoding unit 360 to speed up and/or to quickly converge. By way of example only, the soft reference voltages $V_{kA}$-$V_{kC}$ may be obtained by progressively decreasing the hard reference voltage $V_k$ by a 0.5V step, whereas the soft reference voltages $V_{kD}$-$V_{kF}$ may be obtained by progressively increasing the hard reference voltage $V_k$ by a 0.5V step.

In the following, for the sake of conciseness, the overall reference voltages including both the hard reference voltages $V_k$ and the associated soft reference voltages $V_{kA}$-$V_{kF}$ will be also denoted, as a whole, by reference voltages $V_{kA}, V_{kA}$-$V_{kF}$.

As known, relatively frequent occurrence of soft decoding failures takes place in the known SSD devices, mainly due to retention errors.

According to the Applicant, this is substantially due to the fact that the RBER is affected by retention errors, which cause a relatively frequent occurrence of soft decoding failures (i.e. failures to decode the read bits with an acceptable UBER). Retention errors are caused by charge leakage over time after a memory cell is programmed. Indeed, as SSD device process technology scales to smaller feature sizes, the capacitance of each memory cell, and the number of electrons stored on it, decreases—for example, the known MLC memory cells can only store about 100 electrons. Gaining or losing several electrons on a memory cell can significantly change its threshold voltage and eventually alter its original logical state.

The Applicant has understood that retention errors, and hence the soft decoding failures caused by them, may be influenced by a number of parameters of the SSD device (including, for example, temperature, time from a last writing of the memory cells, and number of program/erase cycles already performed on the memory cells), hereinafter also referred to as operating parameters of the SSD device, and that these operating parameters affect the threshold voltage distributions $D_j$ (and hence the RBER). Starting from this understanding, the Applicant has devised a decoding method (or procedure) generally based on adjusting the (estimate of the) RBER based on one or more among the above operating parameters of the SSD device, thus substantially avoiding, or at least minimizing, additional read operations on the memory cells.

In order to achieve that, the SSD controller 305 according to the present invention comprises one or more measurement units, discussed herebelow, for measuring (or, at least allowing to determine) one or more among the above operating parameters.

As visible in FIG. 3A, the SSD controller 305 comprises a temperature measurement unit 365 for providing a temperature indication indicative of a temperature of the SSD device 300 (and, preferably, of the memory cells 210). For the purposes of the present invention the expression "temperature indication" is intended to encompass both direct measurements (e.g., by means of a temperature sensor), and indirect measurements (e.g., by receiving an output/temperature indication from a temperature sensor or evaluating another property of the SSD device 300 that allows to determine the temperature thereof). Depending on the hardware implementation it may also be necessary to take into account appropriate offset values for the temperature, for example depending on whether a temperature sensor is located in the close vicinity of the memory cells 210 or relatively far from them.

According to an embodiment of the present invention, the temperature measurement unit 365 is a temperature sensor connected to the control unit 325 (e.g., in a bidirectional manner). Without losing generality, the temperature sensor can be any type of temperature sensor, including but not limited to a diode, a NTC ("Negative Temperature Coefficient") resistor, a digital temperature sensor, an infrared sensor, a transistor.

The temperature sensor can be integrated into the flash memory die 200 or, as exemplary illustrated, into the SSD controller 305.

In alternative embodiments of the present invention, not shown, the temperature sensor is a discrete/integrated solution outside the SSD controller 305 or outside the SSD device 300 (being for example part of a slot for receiving the SSD device 300), in which cases the temperature measurement unit 365 may be a temperature interface connecting (i.e., interfacing) the temperature sensor and the control unit 325 to each other.

Additionally or alternatively to the temperature measurement unit 365, the SSD controller 305 comprises a time measurement unit 370 for determining a time indication indicative of a time elapsed since a last writing (program or erase) of the memory cells. Similarly to the above, for the purposes of the present invention, the expression "time indication" is intended to encompass both a direct measurement (e.g., by means of a counter), and an indirect measurement (e.g., by receiving an output/time indication from a counter or evaluating another property of the SSD device 300 that allows to determine such a parameter). Depending on the hardware implementation it may also be necessary to take into account appropriate offset values for the time indication.

As better discussed in the following, according to the present invention, the temperature indication and/or the time indication are used for updating the LLR values in order to soft decode the read bits without additional reading. In order to achieve that, the SSD controller 305 preferably stores, e.g. within the memory unit 340, indications on the predetermined temperature dependence according to which the (estimate of the) RBER changes with temperature and/or the predetermined time dependence according to which the (estimate of the) RBER changes over time, so that the (estimate of the) RBER is corrected (and, hence, the LLR values are updated) according to the temperature and/or time indications and the predetermined temperature and/or time dependences. Preferably, the predetermined temperature and/or time dependences are obtained during the experimental characterization of the SSD device that typically takes place during and/or after the manufacturing thereof.

With reference now to FIG. 4, it schematically shows, according to an embodiment of the present invention, an activity diagram of a decoding procedure 400 carried out by the SSD controller 305 after reading bits (e.g., hard and soft bits) from selected memory cells (for example, a memory page or, as herein assumed by way of example only, a memory block).

Basically, according to the principles of the present invention, the soft decoding procedure 400 is based on applying at least one among the time indication time and the temperature indication to the LLR values used for soft decoding the read bits and obtain the respective information bits. Thus, contrary to the known solutions, which provide for reducing retention errors either by periodically reading, correcting, and reprogramming the memory cells before the number of errors accumulated over time exceed the error correction capability of the ECC code—thus burdening the computational effort of the SSD device—or by increasing the number of soft reference voltages $V_{kA}$-$V_{kF}$ (and hence of read operations of the memory cells)—thus involving very expensive read access times (and, hence, high latency overhead) as well as excessive area overhead—the present invention is based on soft decoding the same read bits by means of different, updated LLR (updated based on temperature and/or time indications), thereby minimizing the additional reading.

According to the preferred, not limiting, illustrated embodiment, the decoding procedure 400 starts by hard decoding (action node 405), preferably at the LDPC decoding unit 360, the read bits being read from any selected group or set of memory cells 210 (for example, a memory block).

As hard decoding could be, alone, successful in determining the information bits, the decoding procedure 400 preferably provides for determining (decision node 410), preferably at the control unit 325 side, whether hard decoding of the current memory block has been successful or has failed (based on the outcome of the decoding output by the LDPC decoding unit 360) before performing any additional reads to recover reliability data.

If hard decoding of the current memory block has failed (exit branch Y of the decision node 410), soft decoding of the read bits is carried out based on the LLR values that are available in the LLR table stored in the control unit 325—action node 415.

Then, a further check is preferably performed (decision node 420) for checking, e.g. still at the control unit 325 side, the success or failure of the soft decoding (based on the outcome of the decoding output by the LDPC decoding unit 360). If the soft decoding has been successful, exit branch N of the decision node 420, the decoding procedure 400 ends (and a new decoding procedure 400 can restart, as such, for decoding further read bits), otherwise (i.e. the soft decoding has failed, exit branch Y of the decision node 420) at least one among (preferably both) the temperature indication and the time indication are retrieved/calculated (action node 425) and applied to the LLR values (action node 430) thereby obtaining updated LLR values, thereafter a new soft decoding is carried out based on the updated LLR values (see arrow connection between the action node 430 and the action node 415). In other words, the nodes (or steps) 415-430 are iterated until the success of the soft decoding (or, preferably, as discussed below, until a predetermined number of iterations).

According to an embodiment of the present invention, as mentioned above, the temperature indication is a temperature difference between the temperature of the SSD device 300 determined during reading of the memory block and the temperature of the SSD device 300 determined during the last writing (i.e., program or erase) of the same memory block, so that such a temperature difference is used (by the control unit 325) for correcting the (estimate of the) RBER (and, hence, the LLR values) based on its (specific) predefined temperature dependence resulting from the initial characterization of the SSD device 300. In other words, by exploiting the predefined temperature dependence of the (estimate of the) RBER and the actual temperature difference experienced by the SSD device 300 since the last writing of the memory block under processing, the changes in the threshold voltage distributions due to such a temperature difference can be inferred to further improve the (estimate of the) RBER and, hence, the LLR values.

According to an embodiment of the present invention, the time indication is a time difference between a time where reading of the memory block took place and a time since the last writing of the memory block, so that such a time difference is used (by the control unit 325) for correcting the (estimate of the) RBER (and, hence, the LLR values) based on its (specific) predefined time dependence resulting from the initial characterization of the SSD device 300. In other words, by exploiting the predefined time dependence of the (estimate of the) RBER and the actual time difference since the last writing of the memory block under processing, the changes in the threshold voltage distributions due to such a time difference can be inferred to further improve the (estimate of the) RBER and, hence, the LLR values.

Back to decision node, if the hard decoding of the current memory page has not failed (exit branch N of the decision node 410), it meaning that the hard decoding has been, alone, successful in recovering valid information bits based only on the hard bits, the decoding procedure 400 ends.

According to an embodiment of the present invention, the decoding procedure 400 is further arranged for exploiting the preferred functionality of the LDPC decoding unit 360 of outputting an indication of a number of errors of a successful decoding. This embodiment is graphically described in FIG. 4 by additional nodes 435-445, discussed herebelow, and whose optional character is conceptually represented by dashed lines.

As visible in the figure, according to this embodiment, if the hard decoding of the current memory page has not failed (exit branch N of the decision node 410), a further check is performed (decision node 435) aimed at comparing (e.g., at the control unit 325 side) the number of errors having affected the successful hard decoding with respect to a predetermined number of errors. Preferably, the predetermined number of errors is indicative of a high probability that a successful hard decoding of the current memory block will fail at the following hard decoding of the same memory block (indeed, nowadays SSD devices typically provide a high number of silent processes involving multiple decoding of same memory blocks, such as for verifying the correct writing of the memory blocks after refresh operations).

If, as a result of such a comparison, the number of errors of the hard decoded bits of the current memory page is lower than (or, at most, equal to) the predetermined number of errors (exit branch N of the decision node 435), the decoding procedure 400 ends (and a new decoding procedure 400 can restart, as such, for decoding further read bits).

Otherwise (exit branch Y of the decision node 435), the current memory block is marked as critical memory block (action node 440) for its following hard decoding, and this information is preferably stored (for example, in a proper memory location, not shown, of the control unit 325, or in the memory unit 340), thereafter the decoding procedure 400 ends (and a new decoding procedure 400 can restart, as such, for decoding read bits of a different memory block).

According to this embodiment, for each execution of the decoding procedure 400 (i.e., for each memory block), a further check is performed (decision node 445), preferably before hard decoding (action node 405), aimed at checking whether the current memory block is a critical memory block. In the affirmative case, (exit branch Y of the decision node 445) the decoding procedure 400 directly jumps to action node 415 (where soft decoding of the read bits takes place), thereby avoiding that a hard decoding that is expected to fail with a certain probability is uselessly performed (thus reducing SSD device latency), otherwise (exit branch N of the decision node 445) the decoding procedure 400 is carried out from action node 405 on (i.e. from the hard decoding on, the hard decoding being thus carried out only on the read bits being read from non-critical memory blocks). For same latency issues, it is possible to provide for alternative embodiments, not shown, wherein the first iteration of the soft decoding is avoided (in which case the decoding procedure 400 would directly jump to action node 425 from the decision node 445).

According to different embodiments of the present invention, additional or alternatively to the previous embodiments, the soft decoding of the read bits is carried out directly, i.e. without hard decoding, thus reducing SSD device latency, based on an operative lifetime of the SSD device 300. These embodiments are graphically described in FIG. 4 by additional node 450, discussed herebelow, and whose optional character is conceptually represented by dashed lines.

If the operative lifetime of the SSD device 300 has reached (being for example equal to or higher than) a predetermined operative lifetime, exit branch Y of the decision node 450, the decoding procedure 400 directly jumps to soft decoding the read bits (action node 415), otherwise the decoding procedure 400 is run from the action node 405 on (or, when provided, from the decision node 445 on). Preferably, as illustrated, the check on the operative lifetime of the SSD device 300 is carried out before the check whether the memory block under processing is a critical memory block or not (decision node 445). According to an embodiment of the present invention, the operative lifetime (and, hence, the predetermined operative lifetime) of the SSD device 300 is associated with a period of use of the SSD device 300. Additionally or alternatively, the predetermined operative lifetime of the SSD device 300 may be associated with a number of program/erase cycles (e.g., a write, erase and rewrite cycle) performed on the SSD device 300. Anyway, any suitable criterion for quantifying the endurance of a SSD device may be used. Possible embodiments of the present invention may provide that the first iteration of the soft decoding is avoided, e.g. when the operative lifetime of the SSD device 300 is such that the soft decoding is expected to fail without updated LLR values (in which case the decoding procedure 400 would directly jump to action node 425 from the decision node 450).

According to a different embodiment of the present invention, additional or alternative to the previous embodiments, the determination of the temperature and/or time indications and the subsequent updating of the LLR values based thereon is avoided after that the soft decoding has reached a predetermined number of iterations, for example indicative of an admitted latency of the solid state drive 300. Indeed, it is expected that the temperature indication does not significantly change, and that the time indication does not change at all, between two following iterations, so that it is expected that after a certain number of iterations the updating of the LLR values ceases to be significant. This embodiment is graphically described in FIG. 4 by additional nodes 455-460, discussed herebelow, and whose optional character is conceptually represented by dashed lines.

If the number of iterations has reached the predetermined number of iterations (exit branch Y of the decision node 455), it meaning that no further update of the LLR values (based on the current hard and soft bits read from the memory block under evaluation) is expected to converge towards a successful soft decoding, the decoding procedure 400 may directly jumps to the next soft decoding iteration (action node 415), or, as exemplary illustrated, additional reads (or soft reads) may be carried out as usual (action node 460) and soft decoding based on (or also on) the soft reads may take place (action node 415). Without losing generality, soft reads may be performed by increasing the number of soft reference voltages $V_{kA}$-$V_{kF}$ or by modifying the soft reference voltages $V_{kA}$-$V_{kF}$ (e.g., according to RBER analysis) and by rereading the memory block by using these modified soft reference voltages $V_{kA}$-$V_{kF}$. As both approaches result in very expensive read access times (and, hence, in latency overhead), it should be understood that thanks to the present invention the soft reads are performed only when strictly necessary, thus increasing the performance of the SSD device 300.

Bach to the activity diagram, when instead the soft decoding has not yet reached the predetermined number of iterations (exit branch N of the decision node 455), the decoding procedure 400 goes on, as such, from the action node 425.

Preferably, as illustrated, the check on the number of iterations is carried out before the determination of the temperature and/or time indications (action node 425) and their application to the LLR values (action node 430). In principles, as it is expected that the temperature indication does not significantly change, and that the time indication does not change at all, between two following iterations, the predetermined number of iterations may be very low (down to one). However, advantageously, the predetermined number of iterations is sufficiently high that, at following iterations, the LLR values are updated even based on further operative parameters of the SSD device 300 (including, for example, program/erase cycles)—in which case a corresponding dependence of the RBER on each further operative parameter is preferably obtained, for example during the characterization of the SSD device 300.

According to another embodiment of the present invention, at each iteration (before reaching the predetermined number of iterations) the LLR values are updated based on a different operative parameter of the SSD device 300 (for example, based on the temperature indication at the first iteration, based on the time indication at the second iteration, based on the number of program/erase cycles at the third iteration, and so on). This could be advantageous when it is desired to distribute the burden of processing of the SSD device 300 among different iterations, or when, for example, one or more operative parameters are not yet available at a given iteration.

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. A method for operating a solid state drive, wherein the solid state drive comprises a plurality of memory cells each one programmable to store a bit pattern among a plurality of bit patterns, each bit pattern being associated with a corresponding nominal threshold voltage of the memory cells, wherein memory cells programmed to store a same bit pattern among said plurality of bit patterns exhibit actual threshold voltages that are variable over the memory cells around the corresponding nominal threshold voltage thereby defining a respective threshold voltage distribution associated with that same bit pattern, and wherein pairs of adjacent bit patterns, which are associated with corresponding adjacent nominal threshold voltages, can be discriminated, during a read operation, by respective first reference voltages between the corresponding adjacent nominal threshold voltages, the method comprising:

performing read operations on a selected memory cell of the solid state drive thereby obtaining read bit patterns, said performing read operations comprising
comparing the actual threshold voltage of the selected memory cell to the respective first reference voltage thereby obtaining a first read bit pattern of said read bit patterns,
comparing the actual threshold voltage of the selected memory cell with a second reference voltage higher than the respective first reference voltage thereby obtaining a second read bit pattern of said read bit patterns, and
comparing the actual threshold voltage of the selected memory cell with a third reference voltage lower than the respective first reference voltage thereby obtaining a third read bit pattern of said read bit patterns;
hard decoding the read bit patterns, wherein said hard decoding comprises performing decoding on the first read bit pattern;
comparing a total number of decoding errors to a predetermined number of decoding errors and determining that said hard decoding has failed if the total number of decoding errors is higher than the predetermined number of decoding errors;
if said hard decoding the read bits has failed:
determining a "Log Likelihood Ratio" (LLR) value comprising an outcome bit pattern associated with the first, second and third read bit patterns, and a reliability indication indicative of a reliability of the outcome bit pattern, the LLR value depending on a "Raw Bit Error Rate" (RBER) estimate being estimated according to a shape of the threshold voltage distributions, and
iterating the following sequence of steps:
soft decoding the read bit patterns, wherein said soft decoding comprises performing decoding on the first, second and third read bit patterns based on said LLR value, and if said soft decoding has failed:
determining one or more operating parameters of the solid state drive, affecting the threshold voltage distributions, said one or more operating parameters comprising at least one among a time indication indicative of a time elapsed since a last writing of the selected memory cell and a temperature indication indicative of a temperature of the selected memory cell, and
applying at least one among said time indication and said temperature Indication to said LLR value, wherein said applying comprises adjusting the RBER estimate based on said at least one among said time Indication and said temperature Indication, and updating the LLR value based on the adjusted RBER estimate.

2. The method of claim 1, wherein said determining at least one among a time indication and a temperature indication, and said applying at least one among said time indication and said temperature indication to said reliability indication are carried out if said soft decoding has failed and if a number of iterations is lower than a predetermined number of iterations.

3. The method of claim 1, further comprising determining an operative lifetime of the solid state drive, and
if the operative lifetime of the solid state drive is lower than a predetermined operative lifetime, performing hard decoding the read bits, or
if the operative lifetime of the solid state drive is higher than the predetermined operative lifetime, performing said iterating.

4. The method of claim 3, wherein said determining an operative lifetime of the solid state drive is based on a number of program/erase cycles performed on the solid state drive.

5. The method of claim 3, wherein said determining an operative lifetime of the solid state drive is based on a time of use of the solid state drive.

6. The method of claim 1, further comprising, after said hard decoding the read bits:
if said hard decoding is successful, determining a number of errors of the decoded read bits, and
if the number of errors of the decoded read bits is higher than a predetermined number of errors indicative that the hard decoding of the same read bits is expected to fail at a following hard decoding thereof, identifying the read bits as critical read bits, said hard decoding the read bits comprising hard decoding only the read bits that are not critical read bits.

7. The method of claim 1, wherein each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution, and wherein said reliability indication depends on a "Raw Bit Error Rate" estimate indicative of overlapping areas between adjacent threshold voltage distributions.

8. The method of claim 7, wherein said temperature indication comprises a temperature difference between a temperature of the memory cells determined during reading of the memory cells and a temperature of the memory cells determined during the last writing of the memory cells, wherein said "Raw Bit Error Rate" estimate changes with temperature according to a predetermined temperature dependence, and wherein said applying said temperature indication to said reliability indication comprises correcting the "Raw Bit Error Rate" estimate according to said temperature difference and to said predetermined temperature dependence.

9. The method of claim 7, wherein said time indication comprises a time difference between a current time where reading of the memory cells takes place and a time since the last writing of the memory cells, wherein said "Raw Bit Error Rate" estimate changes with time according to a predetermined time dependency, and wherein said applying said time indication to said reliability indication comprises correcting the "Raw Bit Error Rate" estimate according to said time difference and to said predetermined time dependence.

10. The method of claim 1, wherein said soft decoding is based on a "Low Density Parity Check" (LDPC) code.

11. Controller for a solid state drive, wherein the solid state drive comprises a plurality of memory cells each one programmable to store a bit pattern among a plurality of bit patterns, each bit pattern being associated with a corresponding nominal threshold voltage of the memory cells, wherein memory cells programmed to store a same bit pattern among said plurality of bit patterns exhibit actual threshold voltages that are variable over the memory cells around the corresponding nominal threshold voltage thereby defining a respective threshold voltage distribution associated with that same bit pattern, and wherein pairs of adjacent bit patterns, which are associated with corresponding adjacent nominal threshold voltages, can be discriminated, during a read operation, by respective first reference voltages between the corresponding adjacent nominal threshold voltages, the controller comprising:

a hard decoding unit for hard decoding read bit patterns being read from a selected memory cell of the solid state drive, wherein the read bit patterns comprise a first read bit pattern obtained by comparing the actual threshold voltage of the selected memory cell to the respective first reference voltage, a second read bit pattern obtained by comparing the actual threshold voltage of the selected memory cell with a second reference voltages higher than the respective first reference voltage, and a third read bit pattern obtained by comparing the actual threshold voltage of the selected memory cell with a third reference voltage lower than the respective first reference voltage, and wherein said hard decoding comprises performing decoding on the first read bit pattern, and a control unit for determining if said hard decoding the read bits has failed by comparing a total number of decoding errors to a predetermined number of decoding errors, and, if said hard decoding the read bits has failed, determining a "Log Likelihood Ratio" (LLR) value comprising an outcome bit pattern associated with the first, second and third read bit patterns, and a reliability indication indicative of a reliability of the outcome bit pattern, the LLR value depending on a "Raw Bit Error Rate" (RBER) estimate being estimated according to a shape of the threshold voltage distributions, and iteratively:

causing a soft decoding unit to soft decode the read bit patterns, wherein said soft decoding comprises performing decoding on the first, second and third read bit patterns based on said LLR value, and if said soft decoding has failed to soft decode the read bit patterns:

causing a time unit to determine one or more operating parameters of the solid state drive affecting the threshold voltage distributions, said one or more operating parameters comprising a time indication indicative of a time elapsed since a last writing of the selected memory cell and/or a temperature unit to determine a temperature indication indicative of a temperature of the selected memory cell, and applying at least one among said time indication and said temperature indication to said LLR value, wherein said applying comprises adjusting the RBER estimate based on said at least one among said time indication and said temperature indication, and updating the LLR value based on the adjusted RBER estimate.

12. The controller of claim 11, wherein the control unit is arranged for causing the time unit to determine the time indication and/or the temperature unit to determine the temperature indication, and for applying at least one among said time indication and said temperature indication to said reliability indication if the soft decoding unit has failed to soft decode the read bits and if a number of iterations is lower than a predetermined number of iterations.

13. The controller of claim 11, wherein the control unit is further arranged for determining an operative lifetime of the solid state drive, and if the operative lifetime of the solid state drive is lower than a predetermined operative lifetime, causing the hard decoding unit to perform said hard decoding of the read bits, or if the operative lifetime of the solid state drive is higher than the predetermined operative lifetime, performing said iterations.

14. The controller of claim 13, wherein the operative lifetime of the solid state drive is based on a number of program/erase cycles performed on the solid state drive.

15. The controller of claim 13, wherein said operative lifetime of the solid state drive is based on a time of use of the solid state drive.

16. The controller of claim 11, wherein if said hard decoding is successful, the hard decoding unit is arranged for providing a number of errors of the decoded read bits, and wherein the control unit is arranged for identifying the read bits as critical read bits if the number of errors of the decoded read bits is higher than a predetermined number of errors indicative that the hard decoding of the same read bits is expected to fail at a following hard decoding thereof, the control unit causing the hard decoding unit to perform said hard decoding only on the read bits that are not critical read bits.

17. The controller of claim 11, wherein each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution, and wherein said reliability indication depends on a "Raw Bit Error Rate" estimate indicative of overlapping areas between adjacent threshold voltage distributions.

18. The controller of claim 17, wherein said temperature indication comprises a temperature difference between a temperature of the memory cells determined during reading of the memory cells and a temperature of the memory cells determined during the last writing of the memory cells, wherein said "Raw Bit Error Rate" estimate changes with temperature according to a predetermined temperature dependence, and wherein the control unit is arranged for applying said temperature indication to said reliability indication by correcting the "Raw Bit Error Rate" estimate according to said temperature difference and to said predetermined temperature dependence.

19. The controller of claim 17, wherein said time indication comprises a time difference between a current time where reading of the memory cells takes place and a time since the last writing of the memory cells, wherein said "Raw Bit Error Rate" estimate changes with time according to a predetermined time dependency, and wherein the control unit is arranged for applying said time indication to said reliability indication by correcting the "Raw Bit Error Rate" estimate according to said time difference and to said predetermined time dependence.

20. The controller of claim 11, wherein said soft decoding unit is based on a "Low Density Parity Check" (LDPC) code.

21. Solid state drive comprising:
a plurality of memory cells each one programmable to store a bit pattern among a plurality of bit patterns, each bit pattern being associated with a corresponding nominal threshold voltage of the memory cells, wherein memory cells programmed to store a same bit pattern among said plurality of bit patterns exhibit actual threshold voltages that are variable over the memory cells around the corresponding nominal threshold voltage thereby defining a respective threshold voltage distribution associated with that same bit pattern, and wherein pairs of adjacent bit patterns, which are associated with corresponding adjacent nominal threshold voltages, can be discriminated, during a read operation, by respective first reference voltages between the corresponding adjacent nominal threshold voltages,
reading circuits for reading bit patterns including first, second and third read bit patterns from a selected memory cell of the solid state drive, wherein the reading circuits are configured to
compare the actual threshold voltage of the selected memory cell to the respective first reference voltage thereby obtaining the first read bit pattern,
compare the actual threshold voltage of the selected memory cell with a second reference voltages higher than the respective first reference voltage thereby obtaining the second read bit pattern, and
compare the actual threshold voltage of the selected memory cell with a third reference voltage lower than the respective first reference voltage thereby obtaining the third read bit pattern;
a hard decoding unit for hard decoding the read bits, wherein said hard decoding comprises performing decoding on the first read bit pattern;
a control unit for determining if said hard decoding has failed by comparing a total number of decoding errors to a predetermined number of decoding errors, and if said hard decoding has failed,
determining a "Log Likelihood Ratio" (LLR) value comprising an outcome bit pattern associated with the first, second and third read bit patterns, and a reliability indication indicative of a reliability of the outcome bit pattern, the LLR value depending on a "Raw Bit Error Rate" (RBER) estimate being estimated according to a shape of the threshold voltage distributions, and iteratively:
causing a soft decoding unit to soft decode the read bit patterns, wherein said soft decoding comprises performing decoding on the first, second and third read bit patterns based on said LLR value, and if the soft decoding unit has failed to soft decode the read bit patterns:
causing one or more units to determine one or more operating parameters of the solid state drive affecting the threshold voltage distributions, said one or more units comprising a time unit and/or a temperature unit, said one or more operating parameters comprising a time indication determined by the time unit and indicative of a time elapsed since a last writing of the selected memory cell, and a temperature indication determined by the temperature unit and Indicative of a temperature of the selected memory cell, and
applying at least one among said time indication and said temperature indication to said LLR value, wherein said applying comprises adjusting the RBER estimate based on said at least one among said time indication and said temperature indication, and updating the LLR value based on the adjusted RBER estimate.

22. The solid state drive of claim 21, wherein the control unit is arranged for causing the time unit to determine the time indication and/or the temperature unit to determine the temperature indication, and for applying at least one among said time indication and said temperature indication to said reliability indication if the soft decoding unit has failed to soft decode the read bits and if a number of iterations is lower than a predetermined number of iterations.

23. The solid state drive of claim 21, wherein the control unit is further arranged for determining an operative lifetime of the solid state drive, and
if the operative lifetime of the solid state drive is lower than a predetermined operative lifetime, causing the hard decoding unit to perform said hard decoding of the read bits, or
if the operative lifetime of the solid state drive is higher than the predetermined operative lifetime, performing said iterations.

24. The solid state drive of claim 23, wherein the operative lifetime of the solid state drive is based on a number of program/erase cycles performed on the solid state drive.

25. The solid state drive of claim 23, wherein said operative lifetime of the solid state drive is based on a time of use of the solid state drive.

26. The solid state drive of any claim from 22, wherein if said hard decoding is successful, the hard decoding unit is arranged for providing a number of errors of the decoded read bits, and wherein the control unit is arranged for identifying the read bits as critical read bits if the number of errors of the decoded read bits is higher than a predetermined number of errors indicative that the hard decoding of the same read bits is expected to fail at a following hard decoding thereof,
the control unit causing the hard decoding unit to perform said hard decoding only on the read bits that are not critical read bits.

27. The solid state drive of claim 21, wherein each memory cell comprises a floating gate transistor adapted to store a bit pattern, among a plurality of possible bit patterns, when programmed at a threshold voltage associated with that bit pattern, each threshold voltage being variable over the memory cells thereby defining a corresponding threshold voltage distribution, and wherein said reliability indication depends on a "Raw Bit Error Rate" estimate indicative of overlapping areas between adjacent threshold voltage distributions.

28. The solid state drive of claim 27, wherein said temperature indication comprises a temperature difference between a temperature of the memory cells determined during reading of the memory cells and a temperature of the memory cells determined during the last writing of the memory cells, wherein said "Raw Bit Error Rate" estimate changes with temperature according to a predetermined temperature dependence, and wherein the control unit is arranged for applying said temperature indication to said reliability indication by correcting the "Raw Bit Error Rate"

estimate according to said temperature difference and to said predetermined temperature dependence.

29. The solid state drive of claim 27, wherein said time indication comprises a time difference between a current time where reading of the memory cells takes place and a time since the last writing of the memory cells, wherein said "Raw Bit Error Rate" estimate changes with time according to a predetermined time dependency, and wherein the control unit is arranged for applying said time indication to said reliability indication by correcting the "Raw Bit Error Rate" estimate according to said time difference and to said predetermined time dependence.

30. The solid state drive of claim 21, wherein said soft decoding unit is based on a "Low Density Parity Check" (LDPC) code.

31. The solid state drive of claim 21, wherein the memory cells are flash memory cells.

32. The solid state drive of claim 21, wherein said memory cells are NAND flash memory cells.

* * * * *